(12) United States Patent
Nam et al.

(10) Patent No.: US 7,642,882 B2
(45) Date of Patent: Jan. 5, 2010

(54) MULTI-BAND FILTER MODULE AND METHOD OF FABRICATING THE SAME

(75) Inventors: Kuang-woo Nam, Yongin-si (KR); In-sang Song, Yongin-si (KR); Chul-soo Kim, Yongin-si (KR); Yun-kwon Park, Yongin-si (KR); Eun-seok Park, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 158 days.

(21) Appl. No.: 11/646,502

(22) Filed: Dec. 28, 2006

(65) Prior Publication Data

US 2008/0024245 A1    Jan. 31, 2008

(30) Foreign Application Priority Data

Jul. 27, 2006 (KR) ............... 10-2006-0071079

(51) Int. Cl.
H03H 9/70 (2006.01)
H03H 9/72 (2006.01)
(52) U.S. Cl. ............... 333/133; 333/189; 333/193
(58) Field of Classification Search ............... 333/133, 333/193, 189; 310/313 B, 313 D
See application file for complete search history.

(56) References Cited

U.S. PATENT DOCUMENTS

| | | | |
|---|---|---|---|
| 6,424,238 B1 * | 7/2002 | Penunuri | 333/187 |
| 6,472,954 B1 * | 10/2002 | Ruby et al. | 333/133 |
| 6,580,197 B2 * | 6/2003 | Flowers | 310/313 R |
| 6,765,456 B2 * | 7/2004 | Ehara et al. | 333/133 |
| 6,870,440 B2 * | 3/2005 | Komazaki et al. | 333/133 |
| 7,078,984 B2 * | 7/2006 | Komuro et al. | 333/133 |
| 7,102,460 B2 * | 9/2006 | Schmidhammer et al. | 333/133 |
| 7,439,825 B2 * | 10/2008 | Nam et al. | 333/191 |
| 7,446,629 B2 * | 11/2008 | Nakamura et al. | 333/133 |

FOREIGN PATENT DOCUMENTS

| | | | | |
|---|---|---|---|---|
| JP | 03-006912 | * | 1/1991 | 310/313 B |
| JP | 9-284093 | * | 10/1997 | |

* cited by examiner

*Primary Examiner*—Barbara Summons
(74) *Attorney, Agent, or Firm*—Sughrue Mion, PLLC

(57) ABSTRACT

A multi-band filter module and a method of fabricating the same are provided. The multi-band filter module includes a piezoelectric substrate, a first filter provided on the piezoelectric substrate, and a second filter provided adjacent to the first filter on the piezoelectric substrate, and operating in a frequency band that is lower than that of the first filter.

3 Claims, 3 Drawing Sheets

MULTI-BAND FILTER MODULE AND METHOD OF FABRICATING THE SAME

CROSS-REFERENCE TO RELATED APPLICATIONS

This application claims priority from Korean Patent Application No. 10-2006-0071079, filed Jul. 27, 2006, in the Korean Intellectual Property Office, the entire contents of which is incorporated by reference.

BACKGROUND OF THE INVENTION

1. Field of the Invention

Apparatuses and methods consistent with the present invention relate to a filter module, and more particularly to a multi-band filter module available in various frequency bands and a method of fabricating the multi-band filter module.

2. Description of the Related Art

Recently, as telecommunication appliances represented by mobile phones are rapidly popularized, demand for a thin and light filter for use in these appliances also increases.

In particular, as the telecommunication appliances are miniaturized and become more complicated, there is a need for a small-sized terminal able to utilize multiple frequency bands. In order to utilize multiple frequency bands, a multi-band filter is acutely needed, which filters only required frequencies among signals received through one antenna. An existing method of implementing a multi-band filter using of a ceramic filter has weak competitiveness in comparison with an Film Bulk Acoustic Resonator (FBAR) or a Surface Acoustic Wave (SAW) device in view of its size and properties.

Up to now, the smallest device having a good frequency characteristic in the 2 GHz band is the FBAR using the bulk acoustic characteristic, while the smallest device having a good performance in the 900 MHz band is the SAW device using the surface acoustic characteristic.

The FBAR has the advantages of mass production and miniaturization. Also, the FBAR has a high quality factor that is a major property of a filter, and can be used in a micro frequency band, in particular, in the Personal Communication System (PCS) band and a Digital Cordless System (DCS) band.

The FBAR is generally fabricated by sequentially depositing a lower electrode, a piezoelectric layer, and an upper electrode on a substrate. According to the operating principle of the FBAR device, electric energy is applied to the electrodes to induce an electric field in the piezoelectric layer that is temporally varied, and then the electric field causes a bulk acoustic wave in the same direction as a vibration direction of a resonant part in the piezoelectric layer to generate resonance therein.

Both the FBAR and the SAW device utilize the RF characteristic using the acoustic resonance. However, the SAW device can obtain a good characteristic only by using a specific piezoelectric substrate. In the case of the FBAR, although it is not limited to a substrate, a silicon substrate is generally used so as to be inexpensive, integrated, and compatible with IC.

A common multi-band filter is generally fabricated by separately making the above filter devices and combining the filter devices with chips and trimming circuits through additional packaging. The method of fabricating the multi-band filter using a separately made filter has a complicated construction, many defective factors such as short circuits, and an increased size.

Accordingly, a need exists for a development of a multi-band filter module having a thin and simple construction and fabricated by a simple method.

SUMMARY OF THE INVENTION

An aspect of the present invention is to provide a multi-band filter module into which an FBAR and a SAW device are integrated, and a method of fabricating the multi-band filter module.

The foregoing and other objects and advantages are substantially realized by providing a multi-band filter module, according to exemplary embodiments of the present invention, which comprises a piezoelectric substrate, a first filter provided on the piezoelectric substrate, and a second filter provided adjacent to the first filter on the piezoelectric substrate, and operating in a lower frequency band than the first filter.

The first filter may comprise a FBAR.

The FBAR may comprise an air gap provided on the piezoelectric substrate, a resonant part located on the air gap and having a first electrode, a piezoelectric film, a second electrode, and an electrode pad connected to the first and second electrodes, wherein the air group, the resonant part, the piezoelectric film, and the second electrode are sequentially deposited.

The second filter may include a SAW device, and a SAW electrode pad provided on an upper surface of the piezoelectric substrate.

In another aspect of the present invention, there is provided a method of fabricating a multi-band filter module, which comprises: (a) forming an FBAR on a piezoelectric substrate, and (b) forming a SAW device on the piezoelectric substrate, in which steps (a) and (b) are concurrently performed.

Step (a) may comprise (a1) forming a sacrificial layer, wherein the sacrificial layer is used to form an air gap to be recessed on a surface of the piezoelectric substrate, (a2) sequentially depositing a first electrode, a piezoelectric plate, and a second electrode on the piezoelectric substrate to form a resonant part, (a3) depositing an electrode pad, which connects to the first and second electrodes, and (a4) removing the sacrificial layer to form the air gap corresponding to the resonant part.

Step (b) may comprise (b1) patterning the SAW device on the piezoelectric substrate, and (b2) forming a SAW pad to be connected to the SAW device.

Step (b1) may be performed at the same time as when the first electrode is formed in the step (a2).

Step (b2) may be performed concurrent with the step (a3).

BRIEF DESCRIPTION OF THE DRAWINGS

The above and other aspects of the present invention will become more apparent by describing in detail exemplary embodiments thereof with reference to the attached drawing figures, wherein.

DETAILED DESCRIPTION OF EXEMPLARY EMBODIMENTS OF THE PRESENT INVENTION

Figure 1:
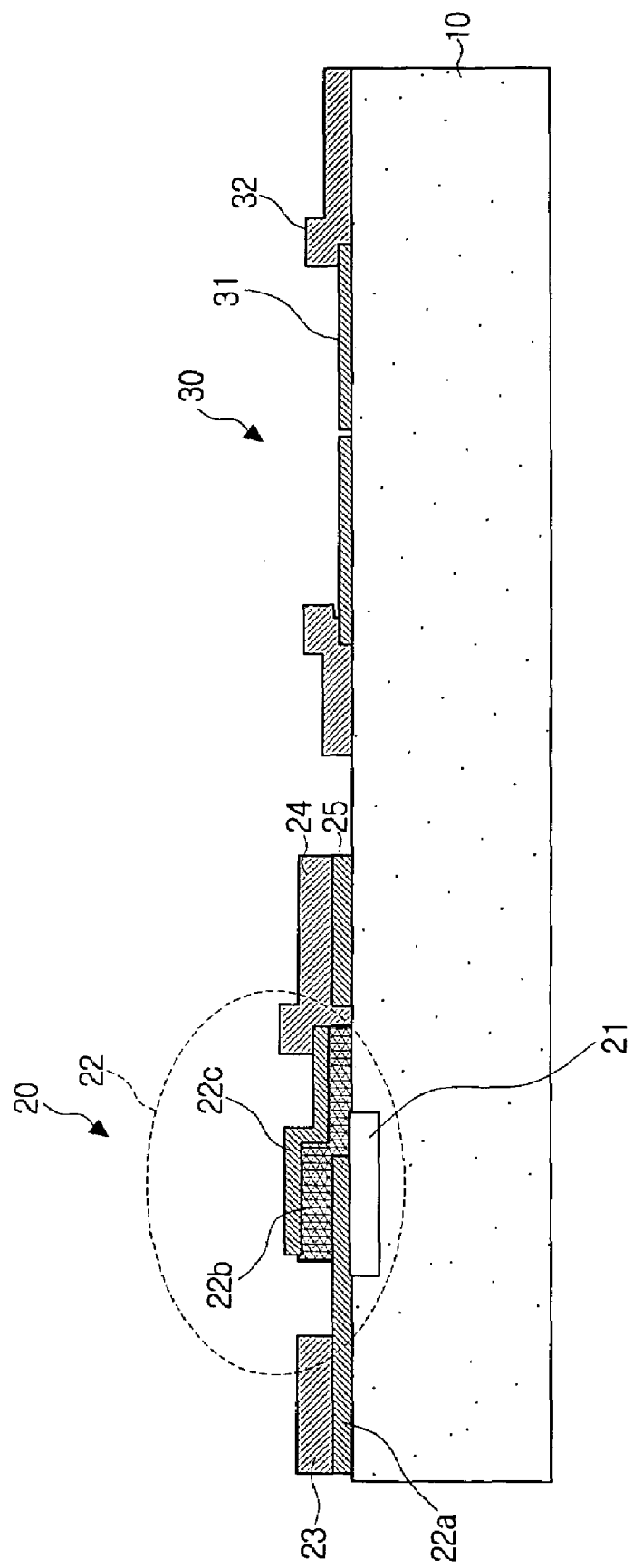
FIG. 1 is a cross-sectional view illustrating a multi-band filter module according to an exemplary embodiment of the present invention.

Hereinafter, exemplary embodiments of the present invention will be described in detail with reference to the accompanying drawing figures.

In the following description, same drawing reference numerals are used for the same elements even in different drawings. The matters defined in the description such as a detailed construction and elements are only provided to assist in a comprehensive understanding of the invention. Thus, it is apparent that the present invention can be carried out without those defined matters. Also, well-known functions or constructions are not described in detail since they would obscure the invention in unnecessary detail.

FIG. 1 is a cross-sectional view illustrating a multi-band filter module according to an exemplary embodiment of the present invention.

Referring to FIG. 1, the multi-band filter module of the present invention filters each required frequency among the signals received by one antenna. More specifically, there is shown a filter module fabricated by simultaneously integrating SAW for a cellular band and FBAR for PCS, on the same substrate.

Referring to FIG. 1, the multi-band filter module includes a piezoelectric substrate 10, and first and second filters formed on the piezoelectric substrate 10.

The piezoelectric substrate 10 can be made of a specific single crystal piezoelectric substance, for example, $LiTaO_3$ or $LiNbO_3$.

The first filter includes an FBAR 20. The FBAR 20 has an air gap 21 formed on the upper surface of the piezoelectric substrate 10, a resonant part 22 formed on the upper surface of the air gap 21, and a pair of electrode pads 23 and 24.

The air gap 21 is formed to have a specific depth extending downwardly from the upper surface of the piezoelectric substrate 10. The air gap 21 is formed under the resonant part 22. The air gap 21 can be created by forming a sacrificial layer to have a specific depth from the upper surface of the piezoelectric substrate 10 and then removing the sacrificial layer.

The resonant part 22 has a first electrode 22a, a piezoelectric film 22b, and a second electrode 22c, which are sequentially deposited so as to be located on the upper portion of the air gap 21.

The resonant part 22 filters a RF signal using a piezoelectric effect of the piezoelectric film 22b. That is, the RF signal applied from the second electrode 22c is output toward the first electrode 22a through the resonant part 22. In this instance, since the resonant part 22 has a constant resonant frequency according to vibration generated by the piezoelectric film 22b, only the input RF signal which corresponds to the resonant frequency of the resonance part 22, is output. In this exemplary embodiment, the resonant part 22 can be used to filter a signal suitable for the PCS using a GHz band.

The resonant part 22 is deposited on and supported by the piezoelectric substrate 10 in such a way that the first electrode 22a covers a portion of the air gap 21. The piezoelectric film 22b is deposited on and supported by the piezoelectric substrate 10 so as to cover the first electrode 22a and the remaining upper surface of the air gap 21. The second electrode 22c is deposited and supported to cover the upper portion of the piezoelectric film 22b.

The first and second electrodes 22a and 22b are made of a common conductive substance such as metal. More specifically, the first and second electrodes 22a and 22b may be made of Al, W, Au, Pt, Ni, Ti, Cr, Pd, or Mo.

The piezoelectric film 22b serves to cause a piezoelectric effect which converts electric energy into mechanical energy of an acoustic wave type, as described above. AlN or ZnO may be used as a piezoelectric substance to form the piezoelectric film 22b.

Each of the electrode pads 23 and 24 is deposited on the upper portions of the first and second electrodes 22a and 22c to have a specific thickness. The electrode pads 23 and 24 may be made of the same conductive substance as that of the first and second electrodes 22a and 22c. Reference numeral 25 in FIG. 1 denotes a support pad formed under the electrode pad 24 which is patterned and formed at the same time when the first electrode 22a is formed.

The second filter includes an SAW device 30 having a good characteristic in the 900 MHz band which is used for a cellular phone. The SAW device 30 includes a SAW device 31 and a SAW electrode pad 32, which are formed on the piezoelectric substrate 10.

The SAW device 31 can be formed in such a way that a comb-like electrode (InterDigital Transducer; IDT) surface faces up on the upper surface of the piezoelectric substrate 10. The SAW device 31 may be formed by depositing a metal substance on the piezoelectric substrate 10 in a desired pattern. In this exemplary embodiment, the SAW device 31 is made of the same substance as that of the first electrode 22a, and is formed simultaneously with the first electrode 22a. Therefore, the SAW device 31 may be made of Al, W, Au, Pt, Ni, Ti, Cr, Pd, or Mo.

The SAW electrode pad 32 is deposited on the upper surface of the piezoelectric substrate 10 in such a way that it is connected to the SAW device 31. The SAW electrode pad 32 is made of the same substance as that of the electrode pads 23 and 24 of the FBAR 20, and is formed simultaneous with the electrode pads 23 and 24. The multi-band filter module according to the exemplary embodiment of the present invention includes the construction in which the FBAR 20 and the SAW device 30 are concurrently formed on single piezoelectric substrate 10. Consequently, it can simplify the process of fabricating the multi-band filter module, and downsize and integrate the construction of the filter module.

The process of fabricating the multi-band filter module according to an exemplary embodiment of the present invention will now be described in detail.

A wafer level packaging method and a fabricating process of the multi-band filter module shown in FIG. 1 will now be described with reference to FIGS. 2A to 2F.

Figure 2A:
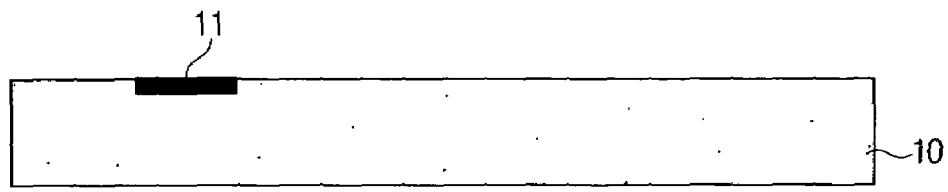
FIGS. 2A to 2E are cross-sectional views explaining a process of fabricating the multi-band filter module in FIG. 1.

As shown in FIG. 2A, a sacrificial layer 11 for forming an air gap is formed on the upper portion of the piezoelectric substrate 10. After a groove is formed to have a specific depth at a point corresponding to the air gap 21 on the piezoelectric substrate 10, the groove is filled with a desired sacrificial substance to form the sacrificial layer 11. The groove for forming the air gap 21 may be formed by dry etching the upper surface of the piezoelectric substrate 10.

Figure 2B:
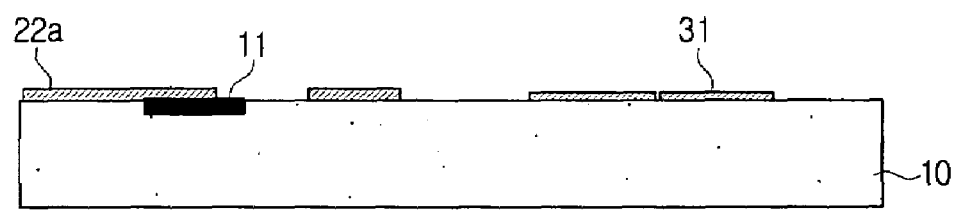

Next, as shown in FIG. 2B, after a desired metal substance is deposited on the piezoelectric substrate 10 and is patterned, the first electrode 22a, the support pad 25, and the SAW device 31 are concurrently formed. The first electrode 22a is formed to cover a portion of the sacrificial layer 11.

Figure 2C:
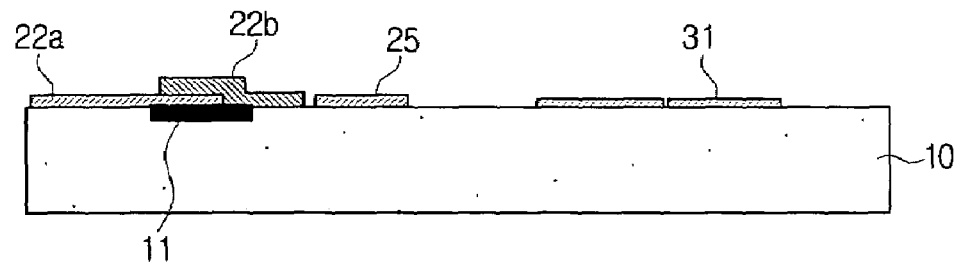

As shown in FIG. 2C, the piezoelectric film 22b is deposited on the piezoelectric substrate 10 to cover the first electrode 22a and the sacrificial layer 11.

Figure 2D:
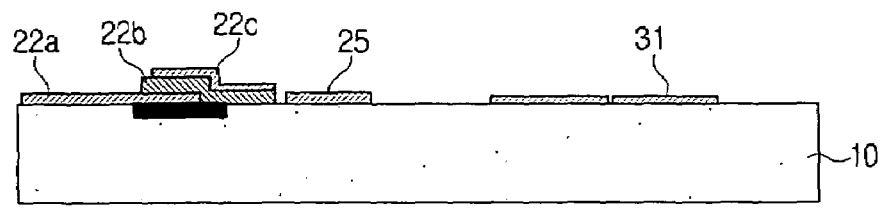

Then, as shown in FIG. 2D, a desired metal substance is deposited on the upper portion of the piezoelectric film 22b in a specific pattern to form the second electrode 22c. The upper electrode 22c may be made of the same substance as that of the first electrode 22a or made of a substance different from that of the first electrode 22a.

Figure 2E:
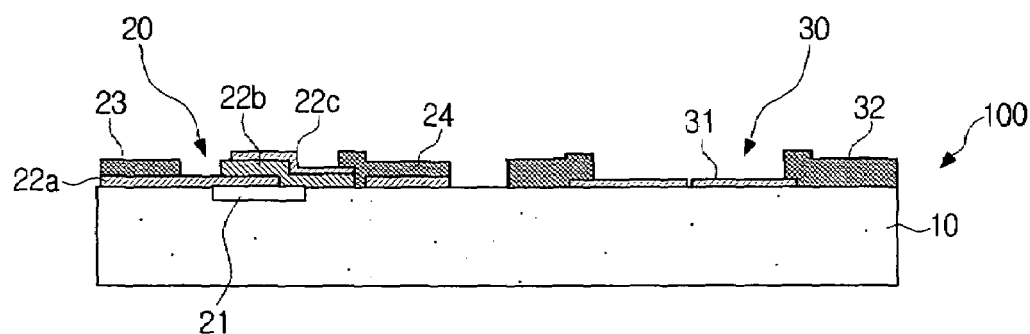

As shown in FIG. 2E, a desired conductive substance is deposited on the upper portion of the piezoelectric substrate 10 in a specific pattern to concurrently form the electrode pads 23 and 24 and the SAW electrode pad 32. Each of the electrode pads 23 and 24 is connected to each of the first and second electrodes 22a and 22c. The SAW electrode pad 32 is formed on the piezoelectric substrate 10 so that it is connected to the SAW device 31.

Next, the sacrificial layer 11 is removed so that the air gap 21 is formed under the resonant part 22 with the first electrode 22a, the piezoelectric film 22b, and the second electric electrode 22c deposited thereon. With the fabricating process, since the FBAR 20 and the SAW device 30 are concurrently formed on the same piezoelectric substrate 10, the fabricating process can be simplified, and filters having different bands can be downsized and integrated.

Figure 2F:
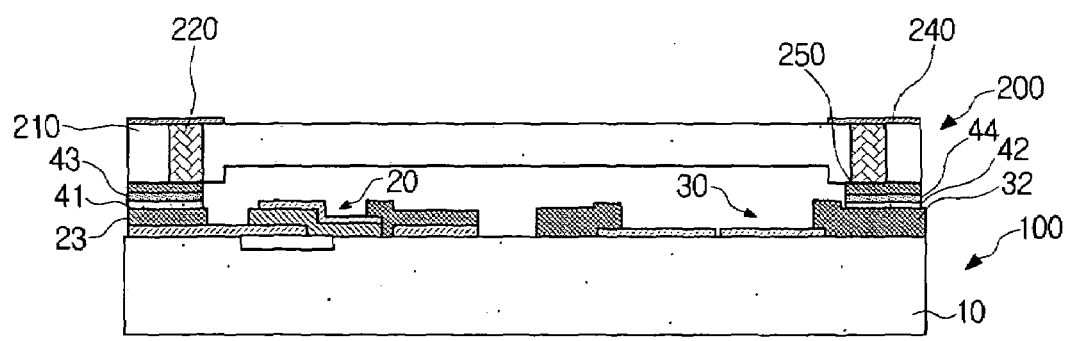
FIG. 2F is a cross-sectional view illustrating a packaged state of the multi-band filter module in FIG. 1.

The multi-band filter module can be subjected to the wafer level packaging through a series of processes, as shown in FIG. 2F. That is, a multi-band filter module 100 fabricated by the above process is located under a packaging, as shown in FIG. 2F. More specifically, referring to FIG. 2F, the multi-band filter module 100 fabricated by the above method is provided under the packaging, and a wafer level packaging cap 200 is packaged and coupled to the upper portion of the filter module 100.

In FIG. 2F, reference numeral 41 and 42 denote a first sealing line provided on the electrode pad 23 and the SAW electrode pad 32, and reference numeral 43 and 44 denote a second sealing line provided on the packaging cap 200 corresponding to the first sealing lines 41 and 42.

The packaging cap 200 includes a cap wafer 210, a via electrode 220 penetrating through the cap wafer 210, and coupling pads 240 and 250 each provided on the upper and lower surfaces of the cap wafer 210. The coupling pads 240 and 250 are connected to the electrode 220. The second sealing lines 43 and 44 are deposited and connected to the lower connecting pad 250.

By connecting the packaging cap 200 configured as described above with the upper portion of the filter module 100, the FBAR 20 and the SAW device 30 can be packaged as one package. Since the first and second sealing lines 41 and 42; 43 and 44 are made of a conductive substance, the filter module 100 is electrically connected to the coupling pad 240 provided on the upper portion of the cap wafer 210.

In the construction of the filter module configured as described above, a duplexer can be implemented by properly combining a plurality of the FBARs 20 or the SAW devices 30 in parallel or series.

The packaging cap 200 does not characterize the present invention. The construction of a prior packaging cap for the wafer level packaging can be coupled to the filter module 100 of the present invention to package the same.

Although not shown, the SAW device 30 and the FBAR 20 are packaged into one chip through the same wafer level packaging. In case a trimming circuit is required to improve characteristics of the SAW device and FBAR, a trimming circuit can be integrated on the piezoelectric substrate 10.

As described above, according to the present invention, the multi-band filter can be modularized by integrating the SAE device and the FBAR onto one substrate. Therefore, since some steps are partially concurrently performed in the process of fabricating the SAW device and the FBAR, the process can be simplified to reduce manufacturing cost.

In addition, since the SAW device and the FBAR are unitarily packaged, the downsized and integrated filter module can be provided.

Additional connection is not required by directly fabricating the SAW and the FBAR on the piezoelectric substrate, thereby improving the signal loss characteristic the reliability.

While the invention has been shown and described with reference to certain exemplary embodiments thereof, it will be understood by those skilled in the art that various changes in form and details may be made therein without departing from the spirit and scope of the invention as defined by the appended claims.

What is claimed is:

1. A multi-band filter module comprising:
   a piezoelectric substrate;
   a first filter provided on the piezoelectric substrate; and
   a second filter provided adjacent to the first filter on the piezoelectric substrate, and operating in a lower frequency band than that of the first filter,
   wherein the first filter comprises an air gap provided on the piezoelectric substrate, a resonant part located on the air gap, and an electrode pad connected to the resonant part, and
   wherein the resonant part comprises a first electrode, a piezoelectric film and a second electrode, and the first electrode, the piezoelectric film, and the second electrode are sequentially deposited.

2. The multi-band filter module of claim 1, wherein the second filter comprises a Surface Acoustic Wave (SAW) device, and a SAW electrode pad provided on an upper surface of the piezoelectric substrate.

3. A multi-band filter module comprising:
   a piezoelectric substrate;
   a first filter provided on the piezoelectric substrate, and
   a second filter provided adjacent to the first filter on the piezoelectric substrate, and operating in a lower frequency band than that of the first filter,
   wherein the first filter comprises an air gap provided on the piezoelectric substrate, a resonant part located on the air gap, and an electrode pad connected to the resonant part and wherein the first filter comprises a Film Bulk Acoustic Resonator (FBAR).

* * * * *